United States Patent
Ishida et al.

(10) Patent No.: US 6,635,950 B1
(45) Date of Patent: Oct. 21, 2003

(54) SEMICONDUCTOR DEVICE HAVING BURIED BORON AND CARBON REGIONS, AND METHOD OF MANUFACTURE THEREOF

(75) Inventors: Hidetsugu Ishida, Kotaira (JP); Seiichi Isomae, Hanno (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/665,616

(22) Filed: Sep. 19, 2000

Related U.S. Application Data

(63) Continuation of application No. 09/024,661, filed on Feb. 17, 1998.

(30) Foreign Application Priority Data

Feb. 26, 1997 (JP) ............................................. 9-042034

(51) Int. Cl.[7] ............................................. H01L 29/167
(52) U.S. Cl. ..................... 257/607; 257/610; 257/611; 257/913; 257/914
(58) Field of Search ................................. 257/372, 376, 257/607, 610, 611, 612, 617, 913, 914, 921

(56) References Cited

U.S. PATENT DOCUMENTS

| | | | |
|---|---|---|---|
| 4,885,257 A | 12/1989 | Matsushita | 437/11 |
| 4,956,693 A | 9/1990 | Sawahata et al. | 357/64 |
| 5,539,245 A | 7/1996 | Imura et al. | 257/610 |
| 5,554,883 A | 9/1996 | Kuroi | 257/617 |
| 5,578,507 A | 11/1996 | Kuroi | 437/24 |
| 5,874,348 A | 2/1999 | Takizawa et al. | 438/473 |

FOREIGN PATENT DOCUMENTS

| | | | |
|---|---|---|---|
| JP | 745526 | 2/1995 | H01L/21/205 |
| JP | 817841 | 1/1996 | H01L/27/08 |

*Primary Examiner*—Bradley William Baumeister
(74) *Attorney, Agent, or Firm*—Antonelli, Terry, Stout & Kraus, LLP

(57) ABSTRACT

To improve the gettering performance by ion implanting boron and improves the production yield of the semiconductor device by using an epitaxial wafer of good quality suppressing the occurrence of dislocations.

For this purpose, an epitaxial wafer in which an epitaxial layer of about 1 $\mu$m is formed to a CZ semiconductor substrate implanted with boron ions which are dopant and carbon ions which are not a dopant is provided, and transistors are formed on the surface of the epitaxial layer.

8 Claims, 8 Drawing Sheets

1 : SEMICONDUCTOR INTEGRATED CIRCUIT DEVICE
2 : SEMICONDUCTOR SUBSTRATE
2S : SEMICONDUCTOR BODY
2E : EPITAXIAL LAYER (SINGLE CRYSTALLINE SEMICONDUCTOR LAYER)
2G : GETTERING LAYER (GETTERING REGION)
2N : N channel MOS · FET
4Nc: GATE INSURATION LAYER
4P : P channel MOS · FET
4Pc: GATE INSURATION LAYER 101 : SEMICONDUCTOR SUBSTRATE
102 : SINGLE CRYSTALLINE SEMICONDUCTOR LAYER
103 : BORON IONS
104 : CARBON IONS
105 : HIGH IMPURITY LAYER INCLUDING BORON AND CARBON
106 : HIGH IMPURITY LAYER INCLUDING BORON 101: SEMICONDUCTOR SUBSTRATE
102: SINGLE CRYSTALLINE SEMICONDUCTOR LAYER
103: BORON IONS
106: HIGH IMPURITY LAYER INCLUDING BORON 1 : SEMICONDUCTOR INTEGRATED CIRCUIT DEVICE
2 : SEMICONDUCTOR SUBSTRATE
2S : SEMICONDUCTOR BODY
2E : EPITAXIAL LAYER (SINGLE CRYSTALLINE SEMICONDUCTOR LAYER)
2G : GETTERING LAYER (GETTERING REGION)
2N : N channel MOS · FET
4Nc: GATE INSURATION LAYER
4P : P channel MOS · FET
4Pc: GATE INSURATION LAYER

2WE: EPITAXIAL WAFER

SEMICONDUCTOR DEVICE HAVING BURIED BORON AND CARBON REGIONS, AND METHOD OF MANUFACTURE THEREOF

This reference is a Continuation application of application Ser. No. 09/024,661, filed Feb. 17, 1998.

BACKGROUND OF THE INVENTION

The present invention concerns a semiconductor wafer, a method of manufacturing the semiconductor wafer, a semiconductor device and a method of manufacturing the semiconductor device. More particularly, it relates to a technique effective for a wafer prepared by forming an epitaxial layer on the surface of a semiconductor substrate, namely, an epitaxial wafer and a semiconductor device using the same.

An epitaxial wafer is a semiconductor wafer of a structure in which an epitaxial layer, formed by epitaxial growth, is disposed on a main surface of a semiconductor wafer which has been mirror polished.

The epitaxial wafer is characterized by being excellent in reduction of soft errors and in latch-up protection, and the withstand voltage characteristic of a gate oxide film formed on the epitaxial layer is satisfactory, thereby remarkably reducing the defect density of the gate oxide film. It has been applied to the production technique for semiconductor integrated circuit devices. The method of manufacturing the epitaxial wafer is described, for example, in Japanese Patent Laid-Open Publication No. 7-45526 (Date of publication: Feb. 14, 1995, Applicant: Hitachi Ltd.).

In a silicon wafer substrate having such an epitaxial growth layer, the boron concentration (so-called substrate impurity concentration) is sometimes set to be higher than the concentration of the epitaxial growth layer in order to reduce latch-up and soft errors and provide gettering sites for heavy metal impurities, particularly for iron. Boron is introduced by a method of introduction during crystal growth and a method of introduction after crystal growth, for example, by ion implantation. For the latter, there has been known a method of manufacturing an epitaxial wafer by implanting boron ions into a silicon substrate and then applying epitaxial growth as disclosed, for example, in Japanese Patent Laid-Open Publication No. 8-17841 (Date of Publication: Jan. 19, 1996). Descriptions will be made hereinafter to the latter prior art.

The object of the prior art concerning an epitaxial substrate is to inhibit diffusion of oxygen from a substrate to an epitaxial layer and obtain an excellent gettering effect.

In the structure of the prior art, impurities to be implanted are ion implanted into a silicon substrate, and then heat treatment for forming nuclei for oxygen precipitation is applied, thereby forming a surface layer extending from the surface of the silicon substrate with a low concentration of the implanted impurities and a low density of nuclei for precipitation, a high density region formed therebelow with a high concentration of implanted impurities and a high density of nuclei for precipitation, and a low density region formed therebelow with a lower concentration of implanted impurities than that of the high density layer and with a lower density of nuclei for precipitation than that of the high density layer, and then an epitaxial layer deposited on the surface layer.

Then, in the prior art, it is disclosed that implanted impurities can be carbon or an impurity having a conductivity type identical with that of a silicon substrate (refer to page 4, right column, "0031"). That is, impurities to be implanted are selected to be either carbon or impurities of a conductivity type identical with that of the silicon substrate.

According to the invention disclosed in the prior art, a high concentration p-type silicon substrate having resistivity of 0.01 Ω.cm or lower or an n-type silicon substrate having specific resistivity of 0.1 Ω.cm or lower is applied as the silicon substrate (refer to page 5, right column, "0043"). That is, this prior art concerns an invention on the premise of a low resistivity substrate in which a great amount of impurities (0.01 Ω.cm≈$10^{18}$ cm$^{-3}$) are introduced, and carbon or impurities of a conductivity type identical with that of the silicon substrate is implanted into the substrate for promoting oxygen precipitation. Particularly, defects in the epitaxial layer caused by oxygen are reduced by lowering the concentration of implanted impurities at the surface layer of the substrate.

However, according to the prior art described above, since the semiconductor substrate has low resistance, there is a problem that the specific resistivity on the surface of the epitaxial layer fluctuates by diffusion from the bottom (rear face) of the substrate. In order to solve the problem, it may be considered to apply a coating of an oxide film to the bottom of the substrate. However, since such a treatment increases the number of manufacturing steps for the epitaxial wafer, it increases the cost of wafers.

In addition, during the heat treatment in the manufacturing step for a semiconductor device using such an epitaxial wafer, dislocations occur from the high boron concentration region in the semiconductor wafer (substrate) formed by ion implantation of boron. During the heat treatment in the manufacturing step of the semiconductor devices, these dislocations rise as far as a region forming the active region (surface of the epitaxial layer) of the semiconductor device to result in worsening of the yield of the semiconductor devices. This problem becomes more conspicuous as the thickness of the epitaxial layer is reduced in order to decrease the wafer cost.

It has been reported to conduct ion implantation of boron (B) and ion implantation of carbon (C) at a high energy into an Si crystal substrate obtained by a FZ method (Float Zone Growth Method) (so-called FZ-SI substrate) by Liefting et al (1992 Material Research Society Symp. Proc. Vol. 235, pp. 179–184; C IMPLANTATION FOR SUPPRESSION OF DISLOCATION).

However, Liefting et al. report the suppression of formation of defects to the FZ-SI substrate used for the manufacture of discrete devices such as diodes, transistors and thyristors. It was not disclosed for an Si crystal substrate obtained by the CZ method (Czochralski grown method) used for the manufacture of semiconductor integrated circuit devices (so-called CZ-Si substrate) and formation of an epitaxial layer on the surface of the CZ-Si substrate.

By the way, Kawagoe et al. propose a technique of providing an epitaxial wafer in which an epitaxial layer is formed to a thickness of not more than 5 μm (specifically, 1 μm) on the surface of a CZ-Si substrate having a high specific resistivity, and forming an MOS.FET on the surface of the epitaxial wafer as disclosed in Japanese Patent Laid-Open Publication No. 8-97163 (Date of Publication; Apr. 12, 1996). Particularly, they propose to deposit polysilicon (polycrystalline silicon) as a gettering layer on the rear face of the wafer in order to improve gettering of heavy metal impurities in the epitaxial wafer.

However, according to the study made by the inventors of the present application, it has been found that the heavy metal impurities can not be gettered sufficiently with the gettering layer formed thus on the rear face of the wafer.

Further, formation of the gettering layer increases the cost of the epitaxial wafer.

In view of the above, the present inventors have attempted to form a gettering layer at high concentration by ion implantation into the substrate of impurities having a conductivity type identical with that of the substrate (specifically, boron), as another means for improving the gettering performance of the epitaxial wafer using the CZ-Si substrate having a high specific resistivity. However, such means induces dislocations to occur from the high boron impurity concentration region in the semiconductor wafer (substrate) formed by ion implantation of boron during a heat treatment in the manufacturing steps for the semiconductor devices, like in the case of the prior art as described above. During the heat treatment in the manufacturing steps for the semiconductor devices, dislocations rise as far as the surface of the epitaxial layer, resulting in worsening the yield of the semiconductor devices.

Accordingly, the present inventors have made a further attempt to suppress the occurrence of dislocations due to the high concentration region.

An object of the present invention is to provide a technique of improving the gettering performance of a semiconductor wafer having an epitaxial growth layer on the main surface of a semiconductor substrate.

Another object of the present invention is to provide a semiconductor wafer having an epitaxial growth layer with suppressed occurrence of dislocations.

Another object of the present invention is to provide a technique capable of reducing the cost of a semiconductor wafer having an epitaxial growth layer on the main surface of a semiconductor substrate.

A further object of the present invention is to provide a technique capable of improving the performance and the reliability of a semiconductor device and reducing the cost of the semiconductor device.

Furthermore, a specific object of the present invention is to provide a semiconductor wafer having an epitaxial growth layer with suppressed occurrence of dislocations caused by a region containing boron at high concentration, as well as a semiconductor device using the same and a method manufacturing the semiconductor device.

In the semiconductor device according to the present invention, a plurality of transistors (specifically, MOS.FETS) are integrated on a semiconductor body having an epitaxial growth layer to constitute a circuit. Further, in the semiconductor device, capacitors and resistors are integrated as required in addition to the transistors.

SUMMARY OF THE INVENTION

At first, an outline of typical examples of inventions among those disclosed by the present application will be shown below.

(1) A semiconductor wafer according to the present invention characteristically has a semiconductor single crystal layer on the main surface of a semiconductor body at least containing boron and carbon. Particularly, it has carbon localized in a semiconductor body containing boron.

Needless to say, the term "localization" used in the present invention includes distribution due to ion implantation or the like.

(2) Further, the semiconductor wafer according to the present invention has a semiconductor single crystal layer on a semiconductor body containing at least boron and carbon, in which the semiconductor single crystal layer is formed by epitaxial growth and has a conductivity type identical with that of the semiconductor body.

(3) The method of manufacturing semiconductor wafers according to the present invention comprises a step of forming, on a semiconductor body containing at least boron and localized carbon, a semiconductor single crystal layer having a conductivity type identical with that of the substrate body by epitaxial growth. In most cases, impurities in the semiconductor single crystal layer contain those at a concentration substantially identical with the design concentration before incorporation of boron and localized carbon in the semiconductor body.

(4) Further, the method of manufacturing the semiconductor device according to the present invention includes a step of providing on a semiconductor body containing an impurity of at least boron and localized carbon, an epitaxially grown semiconductor single crystal layer having a conductivity type identical with that of the impurity and forming an oxide film on the semiconductor single crystal layer. In most cases, impurities in the semiconductor single crystal layer are contained at a concentration substantially identical with the design concentration before incorporation of boron and localized carbon in the semiconductor body.

(5) The semiconductor device according to the present invention has a semiconductor single crystal layer on the surface of a semiconductor body containing at least boron and carbon, in which at least a semiconductor active region is formed on the semiconductor single crystal layer as a matrix material.

The semiconductor active region means a semiconductor surface region in which the transistor operation is conducted.

(6) Further, the method of manufacturing the semiconductor device according to the present invention comprises a step of forming by epitaxial growth, on the surface of a semiconductor body containing boron and carbon as impurities, a semiconductor single crystal layer having a conductivity type identical with that of the impurities, a step of forming a first semiconductor region with an impurity concentration being gradually reduced along the direction of the depth of the semiconductor single crystal layer for a range from the surface of the semiconductor single crystal layer to the upper portion of the semiconductor body, and a step of forming an oxide film on the first semiconductor region. In most cases, impurities in the semiconductor single crystal layer are contained at a concentration substantially identical with the design concentration before incorporation of boron and localized carbon in the semiconductor body.

In this case, a semiconductor substrate having a semiconductor single crystal layer of a conductivity type identical with that of the impurities may also be previously prepared by epitaxial growth on the surface of the semiconductor body containing boron and carbon.

(7) Further, the method of manufacturing the semiconductor device according to the present invention comprises a step of ion implanting impurities into the semiconductor single crystal layer and then thermally diffusing the thus implanted impurities in the step of forming the first semiconductor region.

Further, it is advantageous to make the first semiconductor region as a well for forming a complementary MOS.FET circuit.

DETAILED DESCRIPTION OF THE INVENTION

Figure 1A:
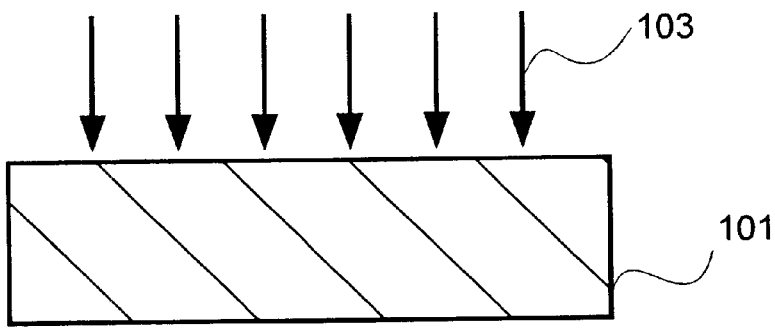
FIGS. 1a, 1b and 1c are cross sectional views of a main portion showing manufacturing steps of an epitaxial wafer according to the present invention.
Figure 1B:
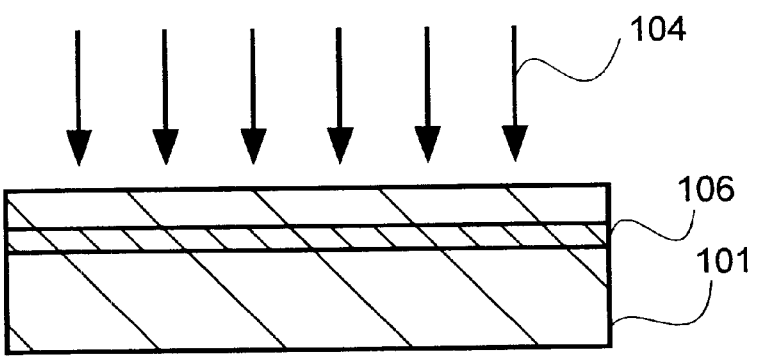

Explanations will be made to basic means according to the present invention with reference to FIGS. 1a and 1b. FIGS. 1a and 1b show fundamental steps thereof.

At first, a silicon substrate is prepared. The silicon substrate is cut out as a wafer in a thin plate shape from an ingot prepared by using, for example, the Czochralski pulling method. Then, for example, it has an oxygen concentration of $9 \times 10^{17}$ atms.cm$^{-3}$ calculated by the JEIDA, a p-conductivity type, boron content of $1.3 \times 10^{15}$ atms.cm$^{-3}$ and a resistivity of 10 Ω.cm (note: JEIDA: Japan Electronic Industry Development Association).

Successively, in the present invention, boron ions 103 are implanted to a silicon substrate 101 as shown in FIG. 1a, and carbon ions 104 may also be implanted simultaneously as shown in FIG. 1b. As the order for implanting such impurities, (1) both of the elements may be implanted simultaneously, (2) carbon ions may be implanted after implantation of boron ions, or, conversely, (3) boron ions may be implanted after implantation of carbon ions. Further, it is desirable that the projected range may be aligned for each of the ion species. In FIG. 1b, reference character 106 points to a high impurity-containing layer having boron as the impurity.

Ion implantation is usually conducted at an acceleration energy ranging about from 10 KeV to 200 KeV. Further, a higher energy, for example, of 5–6 MeV can also be adopted. Referring then to an example for distribution of ions in the direction of the depth of the substrate, in a case of ion implanting boron generally at an acceleration energy of 10 KeV perpendicular to the (100) surface, boron is distributed around a position at a depth of about 30 nm of the substrate as the center. In a case of implantation at 200 KeV, boron is distributed around a position at a depth of about 550 nm of the substrate as the center. In a case of carbon ions, on the other hand, when ion implantation is applied perpendicular to the (100) surface at an acceleration energy of 10 KeV, carbon is distributed around a position at a depth of about 30 nm of the substrate as the center. When it is implanted at 200 KeV, carbon is distributed around a position at a depth of about 300 nm of the substrate as the center. Boron and carbon are thus localized.

The dose rate of boron ions is preferably within a range from $1 \times 10^{11}$ atms.cm$^{-2}$ to $1 \times 10^{12}$ atms.cm$^{-2}$. On the other hand, the dose rate of carbon ions is preferably within a range from $1 \times 10^{11}$ atms.cm$^{-2}$ to $1 \times 10^{16}$ atms.cm$^{-2}$. Implantation of carbon at high concentration ($1 \times 10^{16}$ atms.cm$^{-2}$ or higher) is not preferred for the subsequent manufacture of the semiconductor device. That is, dislocations occur, due to carbon ions, upon heat treatment applied in the manufacture of the semiconductor device. On the other hand, implantation of carbon at low concentration ($1 \times 10^{11}$ atms.cm$^{-2}$ or lower) makes it difficult to suppress the formation of clusters of inter-lattice Si atoms. That is, it is difficult to suppress the occurrence of dislocations caused by boron ion implantation. Accordingly, the dose rate of carbon ions is equal with or greater than the dose rate of boron ions.

For the main surface of the silicon substrate, a (100) surface and a crystal face in the vicinity thereof are adopted in the technical field of the semiconductor devices. The present invention is, needless to say, applicable also into other crystal faces.

After implanting boron ions and carbon ions which are not a dopant system, a heat treatment is applied for the recovery of damages upon ion implantation conducted in the manufacture of the semiconductor device.

Figure 1C:
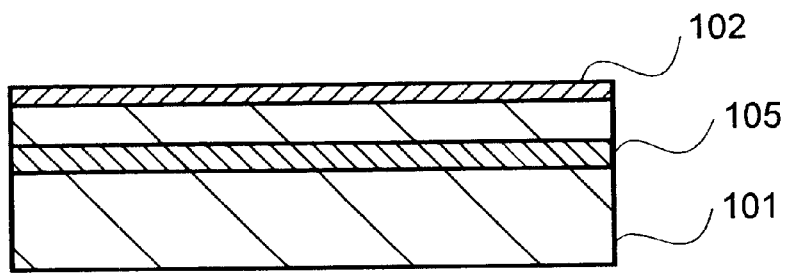

Further, as shown is FIG. 1c, growth of an epitaxial layer 102 is conducted. In this case, the heat treatment for the recovery of damages caused by ion implantation may be conducted in an epitaxial growths furnace. In FIG. 1c, reference character 105 points to a high impurity-containing layer which includes boron and carbon as impurities.

The thickness of the epitaxial layer may be generally considered as below from a practical point of view. The lower limit of the thickness is not less than one-half of the thickness of the gate oxide film in an MOS.FET to be described later. Further, the upper limit for the thickness of the epitaxial layer varies, for example, depending on the products or manufacturing conditions; those can not be defined generally but it is preferred to be about 5 μm or less. They will be explained in Embodiment 2 related with a semiconductor device.

Figure 2A:
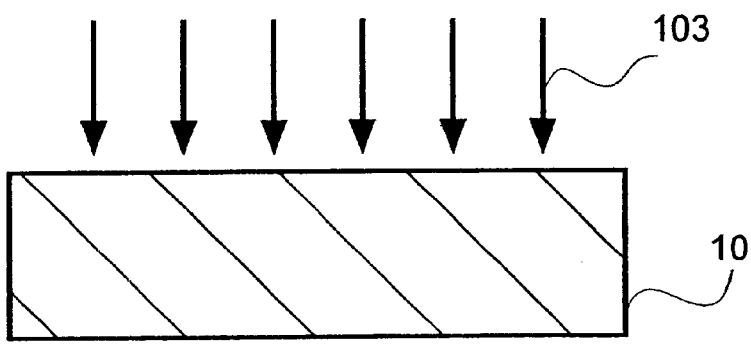
FIGS. 2a and 2b are cross sectional views of a main portion showing manufacturing steps of an epitaxial wafer in a case of applying only boron ion implantation attempted by the present inventors.
Figure 2B:
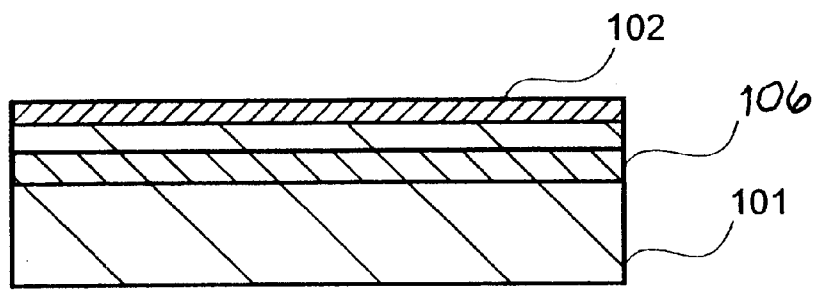

FIGS. 2a and 2b show basic manufacturing steps for an epitaxial wafer for comparison with the present invention attempted by the present inventors.

As shown in FIG. 2a, boron ions 103 are implanted into a silicon substrate 101 to form a high boron concentration region 106 in the silicon substrate. Then, after applying a heat treatment for the recovery of damages upon ion implantation, growth of an epitaxial layer 102 is conducted as shown in FIG. 2b.

Compared with such a comparative example, since implantation of carbon ions as in the present invention has an effect of reducing the implantation damages by the boron ions, induction of defects (dislocations) caused by implantation of boron ions can be reduced to obtain an epitaxial wafer of good quality. That is, clusters formed in the heat treatment in the manufacturing process of the semiconductor device cause dislocations. Occurrence of clusters can be hindered by carbon which is not a dopant system.

Then, according to the method of manufacturing the semiconductor wafer of the present invention described above, it is possible to reduce the cost of a semiconductor wafer capable of providing high semiconductor device characteristics and reliability.

Further, according to the method of manufacturing the semiconductor device of the present invention described above, since a gate oxide film of higher film quality can be formed by forming a gate oxide film of an MOS.FET on a semiconductor single crystal layer, therefore it is possible to improve the withstand voltage of the gate oxide film and extremely reduce the defect density in the gate oxide film. Thereby, it is possible to reduce the cost of semiconductor integrated circuit devices having high device characteristics and reliability. This can also reduce the occurrence of failures and improve the yield.

Further, according to the method of manufacturing the semiconductor device of the present invention described above, since the resistance of the semiconductor body is relatively lowered by providing a high concentration region in which the impurity concentration of the semiconductor body in the lower layer of the semiconductor single crystal layer is made higher than the impurity concentration in the semiconductor single crystal layer, it is possible to improve the influence of the latch-up.

Further, according to the method of manufacturing the semiconductor device of the present invention described above, since a semiconductor integrated circuit device is manufactured by using the epitaxial wafer by forming the semiconductor region by the ion implantation method and the thermal diffusion method, the semiconductor integrated circuit device can be manufactured by using a method identical for the semiconductor integrated circuit device using a usual semiconductor wafer as it is when the semiconductor integrated circuit device is manufactured by using a epitaxial wafer.

Further, according to the method of manufacturing the semiconductor device of the present invention described above, since memory cells of a dynamic random access memory are disposed on a semiconductor single crystal layer with less defects such as oxygen precipitates or vacant hole cluster, a PN junction leak current can be reduced in the source region and the drain region of a transfer MOS.FET of memory cells. Further, since the leakage of charges from the capacitor in the memory cell can be suppressed to extend the refresh time, the refresh time distribution can be improved. Accordingly, it is possible to improve the performance, the reliability and the yield of a dynamic random access memory (DRAM).

In examples to be described later, explanations are made in connection with an example of a semiconductor integrated circuit device by using a dynamic random access memory, but it will be apparent that the effect of the present invention is also obtainable in a modified embodiment or other semiconductor devices. Typical examples of other semiconductor devices can include an SRAM (Static Random access Memory), a ROM (Read Only Memory), an EEPROM (Electrically Erasable Programmable ROM), a flash memory or logic circuit such as of a microcomputer, and a semiconductor integrated circuit device having bipolar transistors and BICMOS circuit.

For example, since junction leakage current in the source region and the drain region of the MOS.FET constituting the memory cell can be reduced by providing a memory cell of a static random access memory on the epitaxial layer with less defects such as oxygen precipitates or vacant hole clusters, it is possible to improve the data retention level and reduce the failure rate of data retention.

Further, it is possible to improve the data writing resistance and reduce scattering for data erase by providing memory cells of a read only memory capable of electrically erasing and writing data on an epitaxial layer with less defects such as oxygen precipitates and vacant hole clusters.

(Embodiment 1)

One embodiment of the present invention will be explained with reference to FIGS. 1a, 1b and 1c.

Boron ions 103 are ion implanted to a silicon wafer of 20 cm diameter (about 8 inch) and having a (100) surface as shown in FIG. 1a. The silicon wafer is cut out from an ingot prepared, for example, by using a Czochralski pulling method and contains oxygen at a concentration of $9\times9^{17}$ atms.cm$^{-3}$ calculated by JEIDA. The conductivity type is p-type and the resistivity is 10 Ω.cm.

Boron ions are ion implanted at an acceleration energy of 100 KeV and with a dose rate of $1\times10^{14}$ atms.cm$^{-2}$. In this case, the dose rate of the boron ions is preferably within a range from $1\times10^{11}$ atms.cm$^{-2}$ to $2\times10^{15}$ atms.cm$^{-2}$. While depending on the specification of the semiconductor device to be formed, the dose rate of the boron ions often used is within a range from $1\times10^{13}$ atms.cm$^{-2}$ to $1\times10^{15}$ atms.cm$^{-2}$, more preferably, within a range from $5\times10^{13}$ atms.cm$^{-2}$ to $5\times10^{14}$ atms.cm$^{-2}$. Further, the acceleration energy often used is within a range from 10 KeV to 100 KeV.

Further, upon boron ion implantation, boron difluoride ions may be ion implanted.

Then, as shown in FIG. 1b, carbon ions 104 are implanted into the provided silicon wafer. The acceleration energy of the carbon ions was set to 190 KeV and the dose rate was set to $1\times10^{15}$ atms.cm$^{-2}$. The dose rate of the carbon ions is preferably within a range from $1\times10^{11}$ atms.cm$^{-2}$ to $1\times10^{16}$ atms.cm$^{-2}$. While depending on the specification of the semiconductor device to be formed, the dose rate of the carbon ions used is often within a range from $1\times10^{14}$ atms.cm$^{-2}$ to $1\times10^{16}$ atms.cm$^{-2}$. Further, the acceleration energy preferably ranges from 10 KeV to 200 KeV.

The silicon wafer thus provided is then subjected to a heat treatment in an epitaxial growth furnace in a hydrogen atmosphere at a temperature of 1000° C., for a heating time of 15 min, to recover damages of ion implantation. Subsequently, a silicon layer of 1 μm thickness was epitaxially grown on the thus provided silicon wafer to prepare an epitaxial wafer. The epitaxial growth is conducted by a CVD method (Chemical Vapor Deposition) by using, for example, a monosilane (SiH$_4$) gas and a hydrogen (H$_2$) gas at about 980° C.

The epitaxial growth itself may be conducted in accordance with a well-known method. For example, it is detailed in "Surface Science Technology Series, No. 3, edited by UCS-Handotai Kiban Gijutsu Kenkyuu-kai, published from Realize Inc. in 1996".

Further, no back coating such as polysilicon or oxide film by a CVD method is applied at the back surface of the silicon wafer thus provided.

In this case, the impurity concentration of the epitaxial growth layer 102 is designed so as to be substantially equal with the impurity concentration in the design of the silicon substrate body 101 before implantation of localized boron and localized carbon. A p-type impurity, for example, boron is introduced in the epitaxial layer 102 in this embodiment, usually at about $1.3 \times 10^{15}$ atms.cm$^{-3}$. Diffusion of boron or carbon previously ion implanted in the substrate to the epitaxial growth layer is substantially negligible during epitaxial growth. This is because the growing time for the formation of the epitaxial layer is as short as less than 10 min.

According to the method of manufacturing the semiconductor wafer of the present invention, it is possible to provide a semiconductor wafer capable of attaining high device characteristics and reliability. Further, it is possible to reduce the manufacturing cost without using an expensive semiconductor substrate.

(Embodiment 2)

Examples of a semiconductor device as another embodiment of the present invention and a manufacturing method thereof will be explained.

Figure 3:
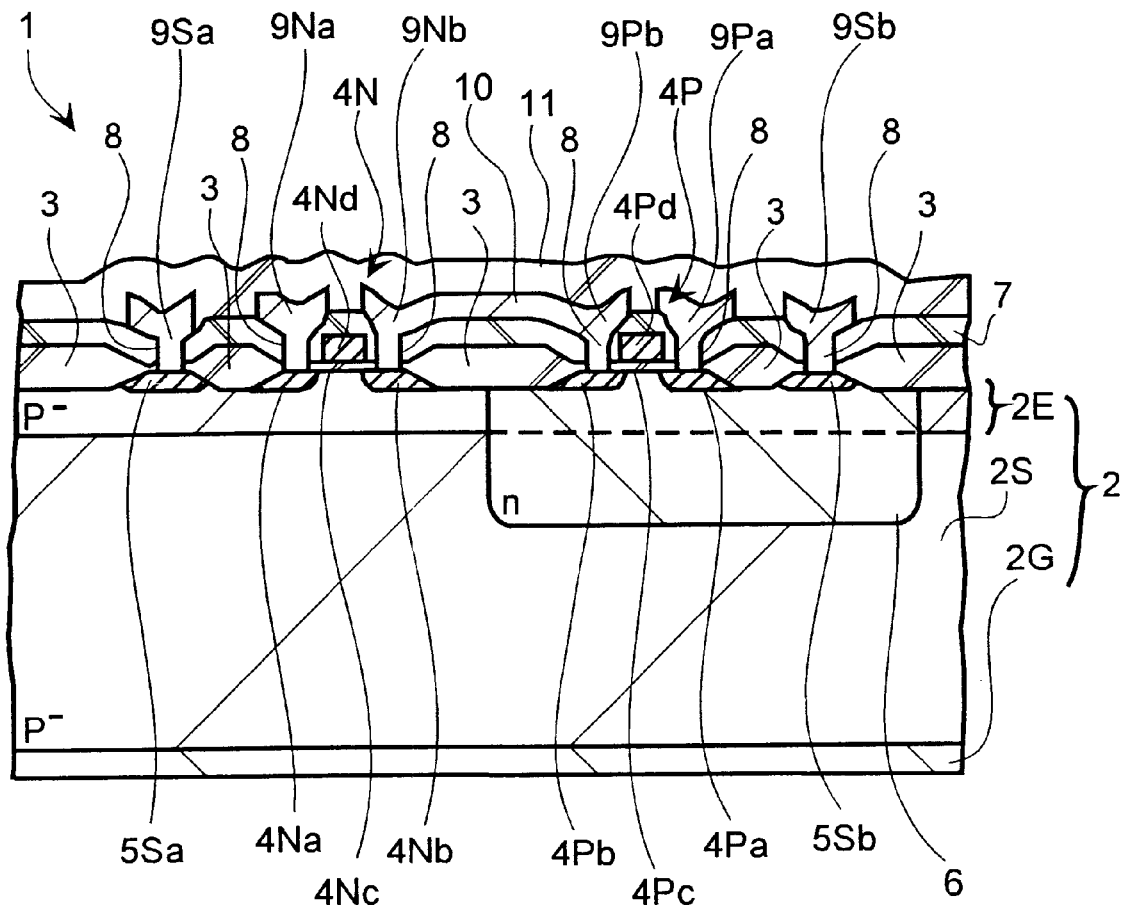
FIG. 3 is a cross sectional view of a main portion of a semiconductor integrated circuit device as an embodiment of the present invention.
Figure 4:
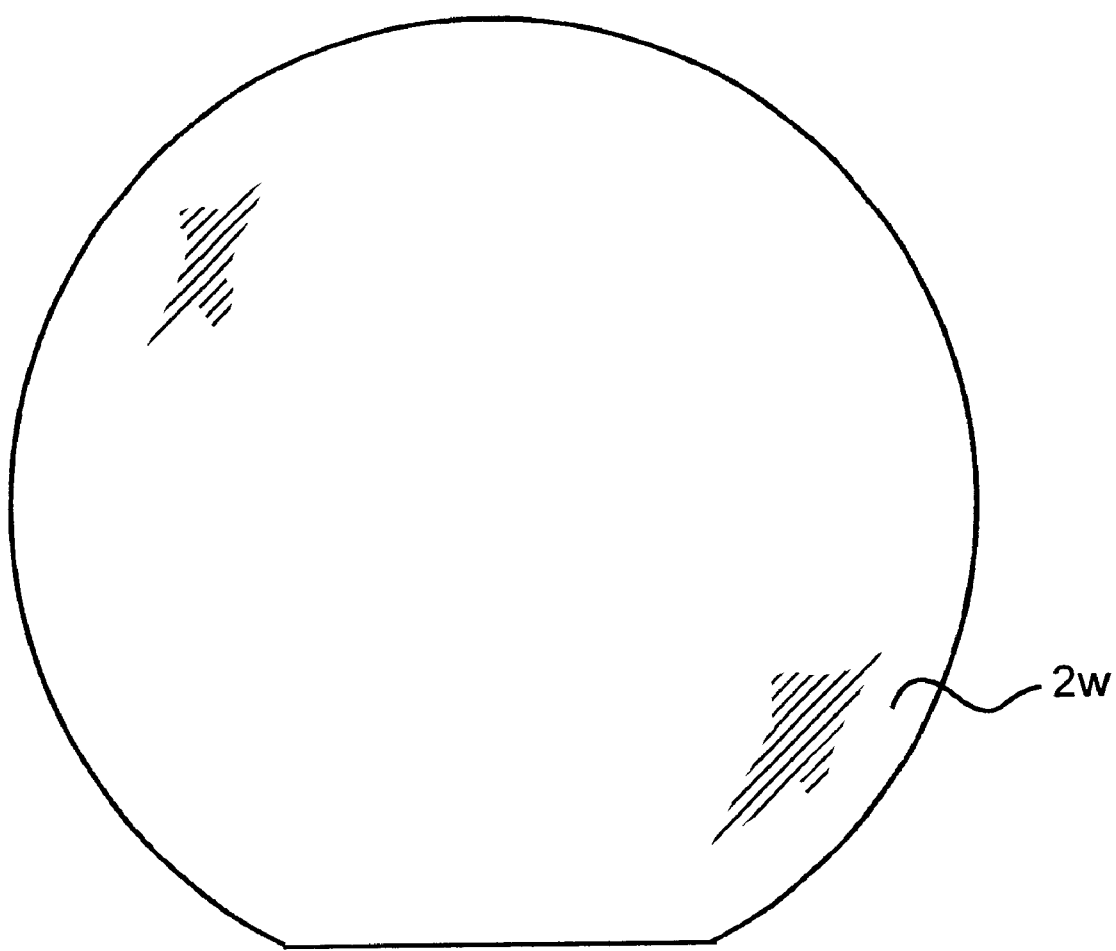
FIG. 4 is a plan view of a semiconductor wafer used during manufacturing steps of a semiconductor integrated circuit device as an embodiment according to the present invention.

FIG. 3 is a cross sectional view for a main portion of a semiconductor integrated circuit device. FIG. 4 is a plan view of a semiconductor wafer used in the manufacturing step of the semiconductor integrated circuit device shown in FIG. 3, and FIG. 5 to FIG. 8 are cross sectional views for a main portion in the manufacturing of the semiconductor integrated circuit device shown in FIG. 3.

A semiconductor substrate 2 constituting a semiconductor integrated circuit device 1 of this embodiment 2 comprises, as shown in FIG. 3, a semiconductor body 2S and an epitaxial layer (single crystal semiconductor layer) 2E. Then, a gettering (capturing) layer 2G formed by a cover of polycrystalline silicon is disposed on the rear face of the semiconductor substrate. The gettering layer 2G is a layer for capturing heavy metal elements. In this embodiment, the gettering layer is disposed for further improving the gettering performance. In the present invention, the gettering layer formed by the cover for the rear face is not an essential factor.

The semiconductor body 2S comprises, for example, p$^-$-type silicon wafer having a thickness of about 700 to 800 $\mu$m. For example, boron as a p-type impurity is already introduced in the semiconductor body 2S upon pulling-up of ingot crystals, and the impurity concentration thereof is, for example, about $1.3 \times 10^{15}$ atms.cm$^{-3}$.

On the main surface of the semiconductor 2S, an epitaxial layer 2E, for example, of p$^-$-type Si, is formed to constitute a so-called epitaxial wafer. For example, boron of p-type impurity is introduced to the epitaxial layer 2E and, as described above, the impurity concentration is equal with the impurity concentration in view of the design of the semiconductor body 2S.

Figure 10:
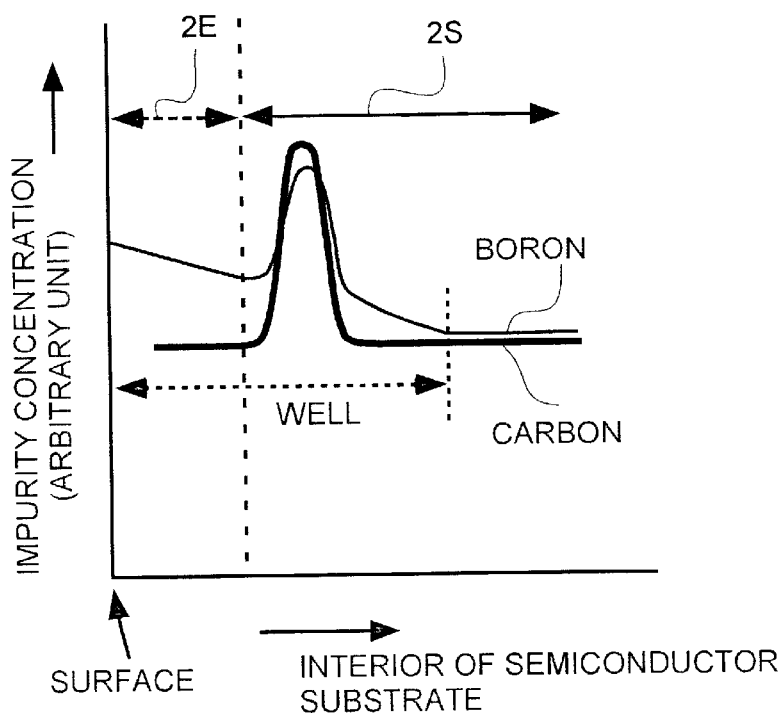
FIG. 10 is a impurity distribution chart in a semiconductor wafer.

In the present invention, as has been explained above, boron ions and carbon ions are previously implanted to the semiconductor substrate. This state can be seen in FIG. 10. However, FIG. 10 shows a distribution of the impurity concentration after preparing the semiconductor integrated circuit device. That is, p-type well (well region of a first conductivity type) in which the impurity concentration is gradually lowered toward the direction of the depth of the epitaxial layer is formed from the surface of the epitaxial layer to the portion above the semiconductor body. A region designated as 2E in FIG. 10 shows an epitaxial layer, while a region designated as 2S shows a semiconductor body portion. Such impurity concentration is measured by using secondary ion mass spectroscopy (SIMS). In FIG. 10, both of boron and carbon show a localized state.

In FIG. 3 to FIG. 9, boron ions and carbon ions localized in the semiconductor body 2S are not illustrated. They are in the same situation as that shown in Embodiment 1. Further, the p-type well of conductivity type identical with that of the semiconductor body and the epitaxial layer is omitted. Basically, it has the same depth as the n-type well shown in FIG. 3 and the impurity distribution is as shown in FIG. 10. In this case, the impurity concentration in view of the design naturally means to include allowable values. That is, concentration equal with the impurity concentration in view of the design means that the impurity concentration in view of the design of the semiconductor substrate is represented by [average: A]±[tolerance: $\alpha$], and means that the impurity concentration is judged to be equal between the semiconductor body 2S and the epitaxial layer 2E in a case where the actual impurity concentration of the semiconductor body 2S is A, if the actually impurity concentration of the epitaxial layer 2E is within a range: A±$\alpha$.

As described above, in this Embodiment 2, since the improved epitaxial wafer is used and an expensive P$^+$-type semiconductor substrate is not used, the cost of the semiconductor substrate 2 can be reduced about to one-half. The epitaxial layer 2E is, for example, about 1 $\mu$m in thickness and is formed relatively thin. Accordingly, the following effects can be obtained.

The lower limit for the thickness of the epitaxial layer 2E is such a thickness as more than one-half of the thickness of the gate oxide film of the MOS.FET to be described later. This is determined considering that one-half of the thickness of the gate oxide film enters into the semiconductor substrate 2 when the gate oxide film of the MOS.FET is formed.

That is, in a case of reducing the thickness of the epitaxial layer 2E to less than one-half of the thickness of the gate oxide film, when the gate oxide film is formed on the epitaxial layer 2E the epitaxial layer 2E is entirely occupied by the gate oxide film, to result in a structure in which the gate oxide film is formed on the upper surface of the semiconductor body 2S, failing to obtain an effect in a case of forming the gate oxide film on the epitaxial layer 2E, namely, the effect capable of forming a satisfactory gate oxide film, improving the withstand voltage of the gate oxide film and the like.

Further, even if crowns are present on the main surface of the semiconductor body 2S, such crowns can be made almost negligible. Further, crowns can be suppressed to the vicinity of the outer circumference of the main surface of the semiconductor wafer caused upon forming the epitaxial layer on the semiconductor wafer.

Since the upper limit for the thickness of the epitaxial layer is different depending on devices or processing conditions, it can not be determined generally but it is preferably, for example, less than 5 $\mu$m. At first, the flatness on the upper surface of the epitaxial layer 2E can be ensured. As the thickness of the epitaxial layer is increased, the difference in the height on the main surface of the semiconductor body 2S is also increased. Secondly, the cost of the wafer can be suppressed to a lowered cost. Thirdly, even if crowns are present on the main surface of the semiconductor body 2S, if the thickness is made to such an extent, there is no large difference in the height due to the crowns.

On the main surface of the epitaxial layer 2E, a device forming region surrounded with a field oxide film 3 comprising, for example, silicon dioxide (SiO$_2$) is formed and, in this region, predetermined electronic circuits such as CMOS (Complementary Metal Oxide Semiconductor) circuits or the like are formed on the main surface of the epitaxial layer 2E. The CMOS circuit is well-known being constituted with an n-channel MOS.FET (hereinafter simply referred to as nMOS) 4N and p-channel MOS.FET (hereinafter simply referred to as pMOS) 4P.

Further, a channel stopper region (not illustrated) is formed in the lower layer of the field oxide film 3.

The concrete structure of the MOS.FET may be, for example, an MOS.FET of a LDD (Lightly Doped Drain) structure but this is not limited only to these examples.

Semiconductor regions 4N$a$, 4N$b$ are a pair of impurity regions forming the source.drain region of NMOS 4N. It has a depth, for example, of about 0.5 μm and is formed within the range for the thickness of the epitaxial layer 2E. Reference 4N$c$ and 4N$d$ respectively represents a gate oxide film and a gate electrode. The gate oxide film 4N$c$ formed on the epitaxial layer 2E comprises, for example, $SiO_2$ of about 180 Å. As described above according to this method, the gate oxide film 4N$c$ of good film quality can be formed to improve the withstand voltage of the gate oxide film 4N$c$. Further, it is possible to improve (reduce) the defect density of the gate oxide film 4N$c$ (number of defects formed in a predetermined range) by more than one digit.

The gate electrode 4N$d$ may be, for example, a usual structure comprising a single layer film of polysilicon of low resistance, or a lamination of a silicide film such as $WSi_2$ on a polysilicon film of low resistance.

On the other hand, the PMOS 4P is formed in an n-well 6 formed to an upper portion (epitaxial layer) of the semiconductor substrate 2, for example, phosphorus or arsenic of n-type impurity is introduced in the n-well 6, and the impurity concentration thereof is, for example, of about $1\times10^{13}$ atms.cm$^{-3}$. The depth of the n-well 6 is, for example, about 1.5 to 4 μm which extends as far as a position deeper than the epitaxial layer 2E.

PMOS 4P has the following constituent factors. Semiconductor regions 4P$a$, 4P$b$ are a pair of impurity regions forming the source drain region of PMOS 4P. Each has a depth, for example, of about 0.5 μm and is formed within the range for the thickness of the epitaxial layer 2E. Reference 4P$c$ and 4P$d$ respectively represents a gate oxide film and a gate electrode. The gate oxide film 4P$c$ formed on the epitaxial layer 2E comprises, for example, $SiO_2$ of about 180 Å thickness. Each of the semiconductor regions 4P$a$, 4P$b$, for example, has a thickness of about 0.5 μm and is formed within a range for the thickness of the epitaxial layer 2E.

The gate oxide film 4P$c$ formed on the epitaxial layer 2E comprises, for example, $SiO_2$ of about 180 Å thickness. This can provide the same effect as explained for the nMOS 4N concerning the film quality of the gate oxide film or the like.

The gate electrode 4P$d$ is constituted in the same manner as explained for the nMOS 4N.

The semiconductor region 5S$a$ and the semiconductor region 5S$b$ are regions for setting the substrate potential for each MOS, which is an n-type impurity region introduced, for example, with phosphorus or arsenic.

An oxide film 7, for example, made of $SiO_2$ is deposited on the semiconductor substrate 2, to which are perforated connection holes so as to expose the semiconductor regions 4N$a$, 4N$b$ of the nMOS 4N, the semiconductor regions 4P$a$, 4P$b$ of the PMOS 4P and the semiconductor regions 5S$a$, 5S$b$ for the substrate potential.

Through the connection holes 8, the semiconductor regions 4N$a$, 4N$b$ of the nMOS 4N are respectively connected electrically with the electrodes 9N$a$, 9N$b$.

Further, the semiconductor regions 4P$a$, 4P$b$ of the PMOS 4P are connected through the connection holes 8 electrically with the electrodes 9P$a$, 9P$b$. Then, the semiconductor region 4N$b$ of the NMOS 4N is electrically connected by way of a first layer wiring 10 connecting between the electrodes 9N$b$ and 9P$b$ with the semiconductor region 4P$b$ of the PMOS 4P.

Further, the semiconductor regions 5S$a$, 5S$b$ for the substrate potential are electrically connected with the electrodes 9S$a$, 9S$b$ respectively.

A surface protection film 11 comprising, for example, an $SiO_2$ film and a silicon nitride film ($Si_3N$) laminated orderly from the lower layer is deposited on the oxide film 7.

Then, a method of manufacturing the semiconductor integrated circuit device of this Embodiment 2 is to be explained with reference to FIG. 4 to FIG. 9.

At first, cylindrical p$^-$-type Si single crystals having a crystal orientation of (100) direction manufactured, for example, by a Czochralski grown method is provided. The impurity used in this case is, for example, boron of p$^-$-type impurity and the impurity concentration is about $1.3\times10^{15}$ atms.cm$^{-3}$.

Successively, the Si single crystal is cut out into a slice to prepare a mirror finished wafer 2W. In this case, various techniques such as a treatment for surface cleaning and a treatment for removing fabrication strains, for example, by a chamfering treatment or chemical etching, and mirror polishing for the main surface of the slice by a mechano-chemical polishing method may be used in accordance with ordinary means. FIG. 4 shows a plan view thereof.

Then, boron ions are implanted to the main surface of a mirror wafer 2W by using a usual ion implanting method. In this case, the acceleration energy was 100 KeV and the dose rate was $5\times10^{14}$ atms.cm$^{-2}$. Further, carbon ions are implanted in the same manner. In this case, the acceleration energy was 190 KeV and the dose rate was $1\times10^{15}$ atms.cm$^{-2}$. In this case, boron difluoride ions may be implanted instead of boron ions. Further, the order of implanting boron and carbon may be reversed or they may be implanted simultaneously.

Figure 5:
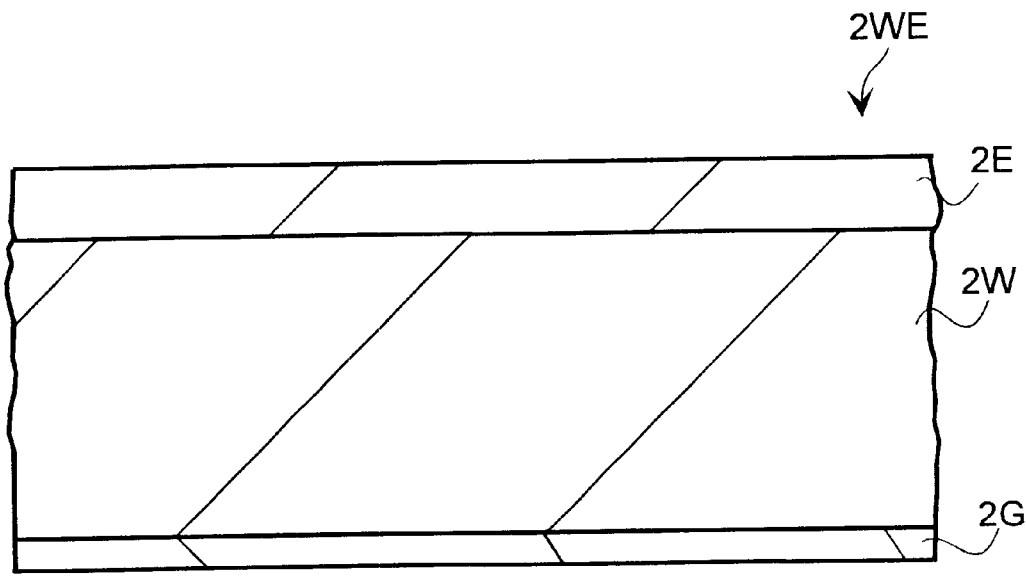
FIG. 5 is a cross sectional view of a portion of an epitaxial wafer in manufacturing steps of a semiconductor integrated circuit device as an embodiment according to the present invention.

Then, for further improving the gettering performance, as shown in FIG. 5, a gettering layer 2G is formed, for example, by depositing polysilicon on the rear face of the mirror surface wafer by a CVD (Chemical Vapor Deposition) method.

Successively, a relatively thin epitaxial layer 2E comprising p$^-$-type Si single crystals, for instance, is formed to about 1 μm thickness on the main surface (mirror surface) of the mirror wafer 2W to complete an epitaxial wafer 2WE. The epitaxial layer may be formed, for example, by using a monosilane ($SiH_4$) gas and a hydrogen ($H_2$) gas and using the CVD method (epitaxial growing method). The impurity concentration of the epitaxial layer 2E is determined to be equal with the impurity concentration in view of the design in the mirror wafer 2W. Prior to the formation of the epitaxial layer, a layer with no substantial defects may be formed.

Figure 6:
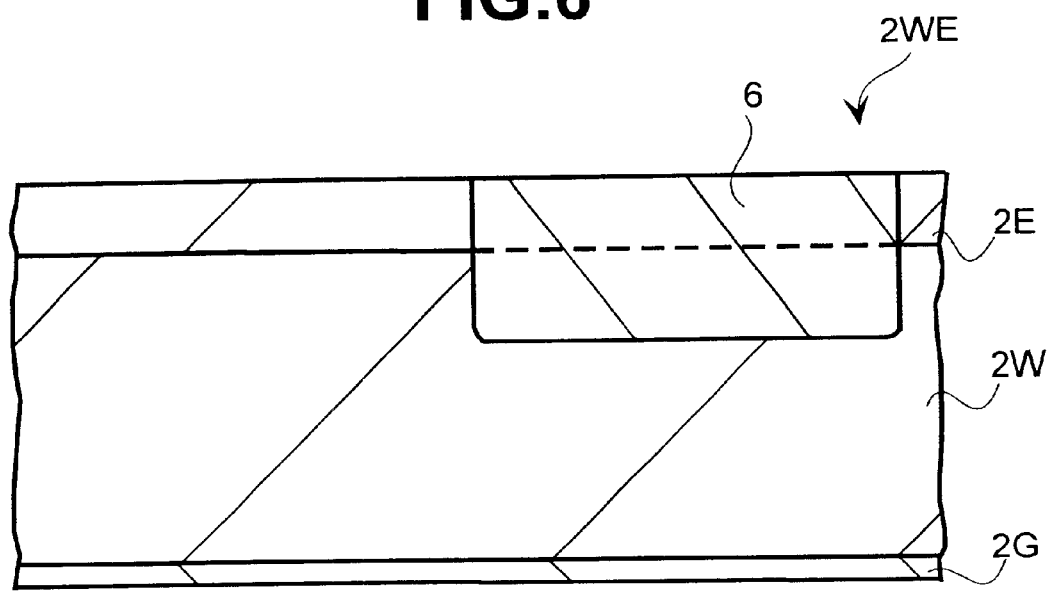
FIG. 6 is a cross sectional view of a portion of a semiconductor integrated circuit device in manufacturing steps of a semiconductor integrated circuit device as an embodiment according to the present invention.

Subsequently, after forming an ion implanting mask on the epitaxial wafer 2WE as shown in FIG. 6, phosphorus or arsenic as n-type impurity, for example, is introduced by an ion implanting method or the like and then a heat treatment is applied to form an n-well 6.

The impurity concentration of the n-well 6 is, for example, about $1\times10^{13}$ atms.cm$^{-3}$, the well 6 is of a depth, for example, of about 1.5 to 4 μm and extends to a position deeper than the epitaxial layer 2E.

Figure 7:
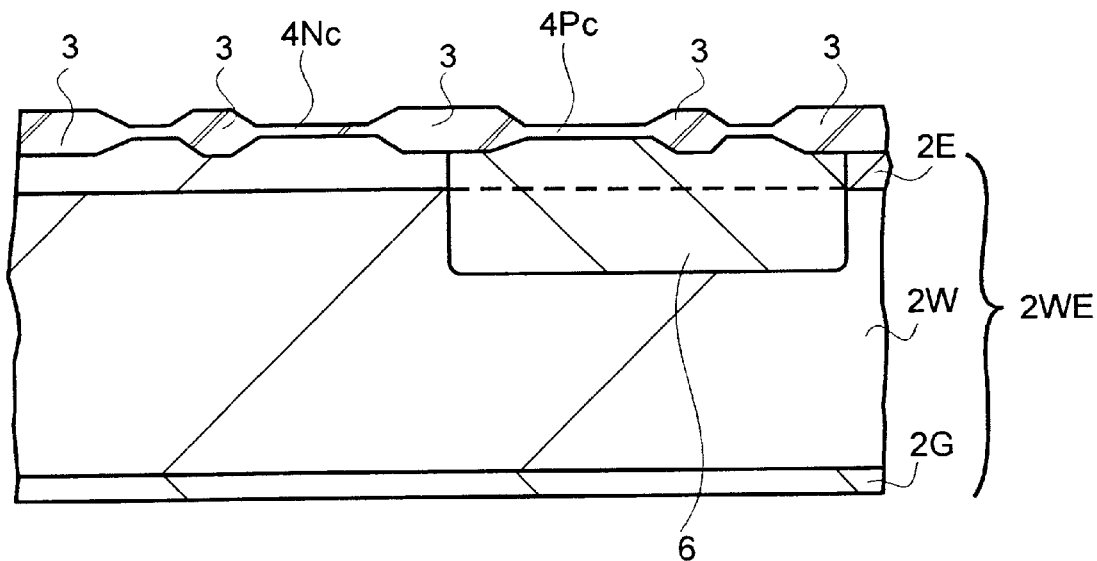
FIG. 7 is a cross sectional view of a main portion of a semiconductor integrated circuit device at a processing step succeeding the processing step forming the structure shown in FIG. 6, in manufacturing the semiconductor integrated circuit device shown in FIG. 3.

Then, as shown in FIG. 7, a field oxide film 3 comprising, for example, $SiO_2$ is formed on the main surface of the epitaxial layer 2E by a usual LOCOS method or the like. Further, gate oxide films 4N$c$, 4P$c$ comprising $SiO_2$ or the like of a thickness, for example, of about 180 Å are formed in device forming regions surrounded with the field oxide film 3 by a thermal oxidation method or the like.

In this Embodiment 2, the gate insulation films 4N$c$, 4P$c$ of more satisfactory film quality can be formed by forming the gate oxide films 4N*c*, 4P*c* on the epitaxial layer 2E, thereby enabling to improve the withstand voltage of the gate oxide films 4N*c*, 4P*c*. Further, it is possible to improve the defect density in the gate oxide films 4N*c*, 4P*c* by more than one digit.

Figure 8:
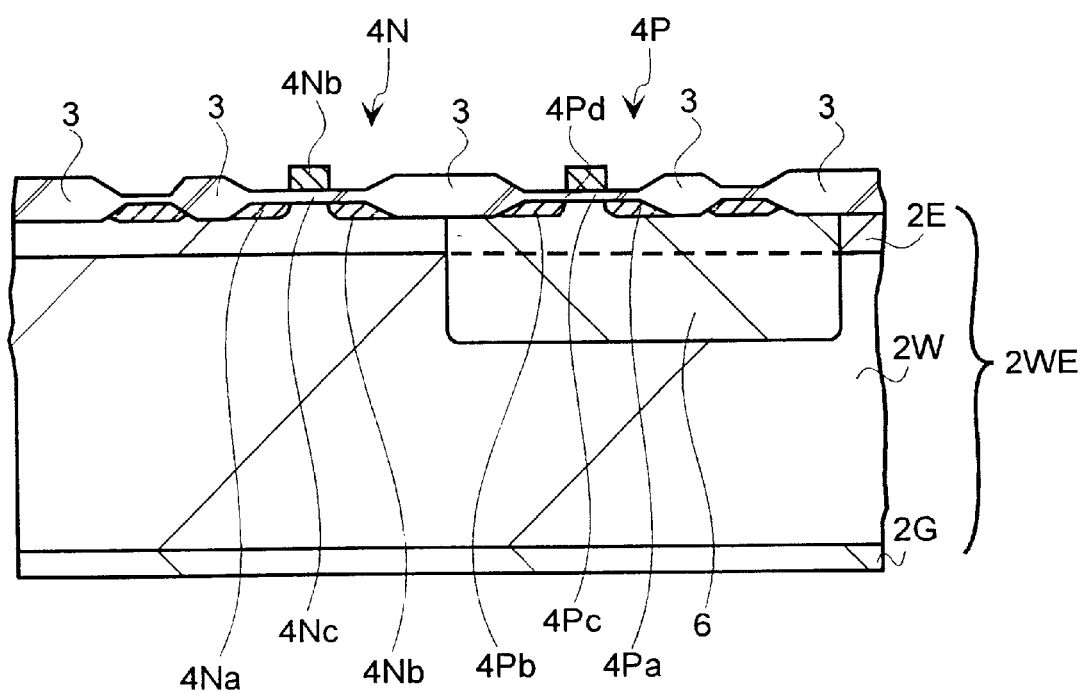
FIG. 8 is a cross sectional view of a main portion of a semiconductor integrated circuit device at a processing step succeeding the processing step forming the structure shown in FIG. 7, in manufacturing the semiconductor integrated circuit device shown in FIG. 3.

Successively, as shown in FIG. 8, gate electrodes 4N*d*, 4P*d* comprising polysilicon of low resistance are formed. Further, a pair of semiconductor regions 4N*a*, 4N*b* and semiconductor regions 4P*a*, 4P*b* as a source region and a drain region are formed by ion implantation at least by way of the gate electrodes 4N*d*, 4P*d* to form nMOS 4N and pMOS 4P.

Figure 9:
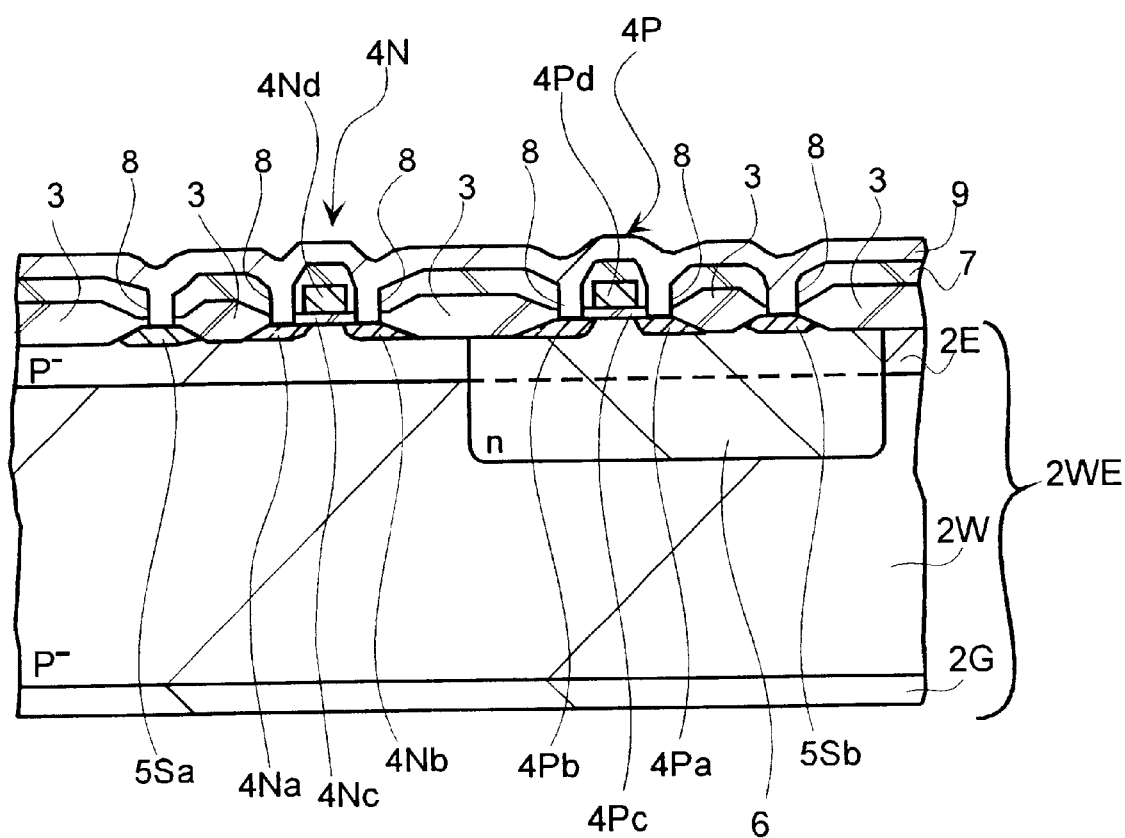
FIG. 9 is a cross sectional view of a main portion of a semiconductor integrated circuit device at a processing step succeeding the processing step forming the structure shown in FIG. 8, in manufacturing the semiconductor integrated circuit device shown in FIG. 3.

Subsequently, after forming the semiconductor regions 5S*a*, 5S*b* respectively, an oxide film 7 comprising, for example, $SiO_2$ is deposited on the epitaxial wafer 2WE as shown in FIG. 9 by the CVD method or the like.

Then, after perforating connection holes 8 to predetermined positions in the oxide film 7, a conductor film 9 comprising, for example, an Al—Si—Cu alloy is deposited on the epitaxial wafer 2WE by means of a sputtering or vapor deposition method. When the conductor film 9 is patterned by dry etching or the like, electrodes 9N*a*, 9N*b*, 9P*a*, 9P*b*, 9S*a*, 9S*b* and the first layer wiring 10 shown in FIG. 3 are formed.

An oxide film comprising $SiO_2$ and a film comprising $Si_3N_4$, for example, are deposited successively by a CVD method on the thus provided semiconductor substrate to form a surface protection film 11. Then, when the silicon wafer is divided into individual semiconductor chips, a semiconductor integrated circuit device 1 shown in FIG. 3 is completed.

Figure 11:
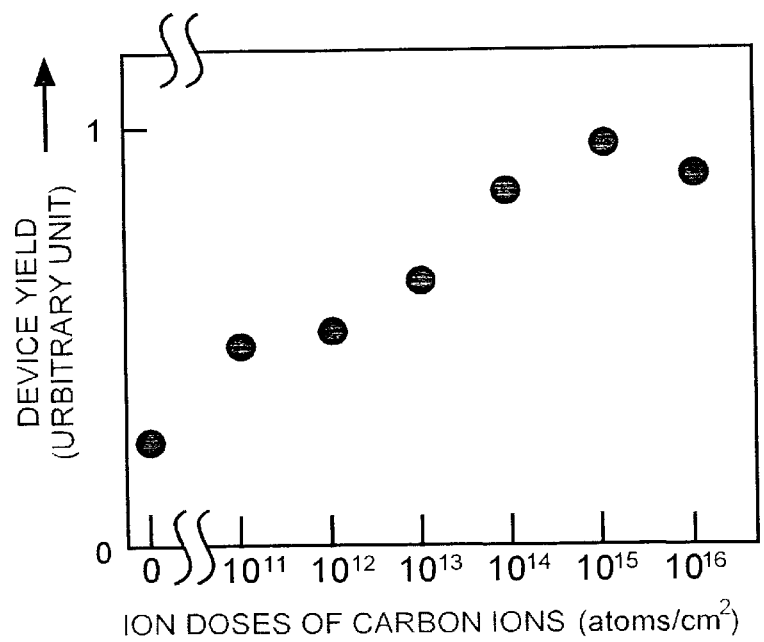
FIG. 11 is a chart showing the yield of semiconductor devices according to the present invention.

FIG. 11 shows a relation between the ion implanting amount of carbon ions to the semiconductor body and the yield of the semiconductor device when the manufacturing method described above is applied to the manufacturing process for a 4M.DRAM. The abscissa indicates the implanting amount of the carbon ions and the ordinate indicates the yield of the semiconductor device. As can be seen from FIG. 11, the yield can be improved remarkably with the carbon implanting amount of more than $1\times10^{11}$ atms.cm$^{-2}$ and from $1\times10^{14}$ atms.cm$^{-2}$ to $1\times10^{16}$ atms.cm$^{-2}$ is preferred.

According to the semiconductor wafer of the present invention, it is possible to obtain highly reliable and satisfactory device characteristics. According to the manufacturing method of the semiconductor wafer of the present invention, a semiconductor wafer of good quality can be provided by suppressing occurrence of dislocations in the epitaxial wafer without using an expensive high concentration semiconductor substrate.

According to the method of manufacturing the semiconductor device of the present invention, it is possible to manufacture a semiconductor device using an epitaxial layer of good quality as the matrix material. Further, since a gate oxide film of good film quality can be formed by forming the gate oxide film of the MOS.FET to the epitaxial layer of good quality, it is possible to improve the withstand voltage of the gate oxide film and reduce the defect density of the gate oxide film. Accordingly, the performance, the manufacturing yield and the reliability of the semiconductor integrated circuit device can be improved. In addition, the cost for the semiconductor integrated circuit device can also be reduced.

According to the method of manufacturing the semiconductor integrated circuit device of the present invention, since a region with a higher impurity concentration than the impurity concentration in the semiconductor single crystal layer is formed on the semiconductor body, the resistance of the semiconductor body is made relatively lower, so that it is possible to improve the latch-up resistance. Accordingly, it is possible to further improve the performance, the manufacturing yield and the reliability of the semiconductor integrated circuit device.

What is claimed is:

1. A semiconductor device comprising:
    a semiconductor substrate of a first conductivity type;
    an epitaxial layer of a first conductivity type formed on the substrate, the epitaxial layer having a surface;
    a well region of a conductivity type formed in the said epitaxial layer, said well region extending from the surface of the epitaxial layer to said substrate and having a surface; and
    a gate insulating layer formed on the surface of said well region,
    wherein the well region includes implanted boron impurities and implanted boron impurities, and wherein a depth of a peak concentration of said implanted boron impurities and a depth of a peak concentration of said implanted carbon impurities are substantially equal.

2. A semiconductor device according to claim 1, further comprising a gettering layer on a rear surface of the semiconductor substrate.

3. A semiconductor device according to claim 1, wherein the implanted carbon impurities are in a localized carbon region.

4. A semiconductor device according to claim 1, wherein said well region extends into said semiconductor substrate.

5. A semiconductor device according to claim 1, wherein the well region extends to a depth in a range of 1.5 to 4 μm from the surface of the epitaxial layer.

6. A semiconductor device according to claim 1,
    wherein the implanted carbon impurities were implanted in an amount of more than $1\times10^{11}$ atoms.cm$^{-2}$.

7. A semiconductor device according to claim 6,
    wherein the implanted carbon impurities were implanted in an amount of $1\times10^{14}$ atoms.cm$^{-2}$ to $1\times10^{16}$ atoms.cm$^{-2}$.

8. A semiconductor device according to claim 1,
    wherein the peak concentrations of said implanted boron impurities and said implanted carbon impurities are located in the semiconductor substrate.

* * * * *